(12) United States Patent
Carpenter et al.

(10) Patent No.: US 12,007,667 B2
(45) Date of Patent: Jun. 11, 2024

(54) METHOD FOR FABRICATION OF RIDGE WAVEGUIDES

(71) Applicant: University of Southampton, Southampton (GB)

(72) Inventors: Lewis Glynn Carpenter, Southampton (GB); Sam Adam Berry, Southampton (GB); Corin Barry Edmund Gawith, Southampton (GB); Peter George Robin Smith, Southampton (GB)

(73) Assignee: University of Southampton, Southampton (GB)

( * ) Notice: Subject to any disclaimer, the term of this patent is extended or adjusted under 35 U.S.C. 154(b) by 290 days.

(21) Appl. No.: 17/619,355

(22) PCT Filed: Jun. 17, 2020

(86) PCT No.: PCT/GB2020/051459
§ 371 (c)(1),
(2) Date: Dec. 15, 2021

(87) PCT Pub. No.: WO2020/254799
PCT Pub. Date: Dec. 24, 2020

(65) Prior Publication Data
US 2022/0299840 A1 Sep. 22, 2022

(30) Foreign Application Priority Data
Jun. 19, 2019 (GB) .................. 1908764

(51) Int. Cl.
*G02F 1/377* (2006.01)
*B26D 3/12* (2006.01)
(Continued)

(52) U.S. Cl.
CPC ............. *G02F 1/3775* (2013.01); *B26D 3/12* (2013.01); *C23C 14/021* (2013.01);
(Continued)

(58) Field of Classification Search
None
See application file for complete search history.

(56) References Cited

U.S. PATENT DOCUMENTS

| 5,838,486 A | 11/1998 | Sonoda et al. |
| 2001/0055453 A1* | 12/2001 | Mizuuchi ............. G02F 1/3775 359/332 |
| 2007/0092194 A1 | 4/2007 | Smith et al. |

FOREIGN PATENT DOCUMENTS

| GB | 2 353 397 A | 2/2001 |
| JP | 2009 025555 A | 2/2009 |

(Continued)

OTHER PUBLICATIONS

P. F. Bordui, et al., "Inorganic Crystals for Nonlinear Optical Frequency Conversion", Anna. Rev. Mater. Sci. 23, 321-379 (1993).
(Continued)

*Primary Examiner* — Chad H Smith
(74) *Attorney, Agent, or Firm* — Renner, Otto, Boisselle, & Sklar, LLP (57) ABSTRACT

A method for fabricating an optical waveguide comprises: providing a sample of lithium niobate doped with magnesium oxide and having at least one grating of periodic domain inversion defined therein; applying a layer of metallic zinc to a surface of the sample over the at least one grating using sputter deposition; heating the sample in an atmosphere of pure oxygen to cause the zinc to indiffuse into the lithium niobate to form a waveguiding layer of increased refractive index under the surface of the sample; and using a dicing blade to cut two substantially parallel channels along a length direction of the at least one grating, to define a ridge waveguide between the two channels.

18 Claims, 6 Drawing Sheets

(51) Int. Cl.
| | |
|---|---|
| C23C 14/02 | (2006.01) |
| C23C 14/18 | (2006.01) |
| C23C 14/34 | (2006.01) |
| C23C 14/58 | (2006.01) |
| G02F 1/35 | (2006.01) |
| G02F 1/355 | (2006.01) |

(52) U.S. Cl.
CPC ............ *C23C 14/185* (2013.01); *C23C 14/34* (2013.01); *C23C 14/5806* (2013.01); *G02F 1/3525* (2013.01); *G02F 1/3551* (2013.01); *G02F 1/3558* (2013.01); *G02F 2202/20* (2013.01)

(56) References Cited

FOREIGN PATENT DOCUMENTS

| JP | 2012 208393 A | 10/2012 |
|---|---|---|
| WO | 2005/052682 A1 | 6/2005 |
| WO | 2009/101390 | 8/2009 |

OTHER PUBLICATIONS

C. Langrock, et al., "All-Optical Signal Processing Using X(2) Nonlinearities in Guided-Wave Devices", J. Light. Technol. 24(7), 2579-2592 (2006).

P. R. Sharapova, et al., "Toolbox for the Design of Linbo3-Based Passive and Active Integrated Quantum Circuits", New J. Phys. 19(123009), (2017).

S. Pal, et al., "Photorefractive Damage Resistance in Ti:PPLN Waveguides with Ridge Geometry", Appl. Phys. B 120, 737-749 (2015).

T. Umeki, et al., "Highly Efficient Wavelength Converter Using Direct-Bonded PpznIn Ridge Waveguide", IEEE J. Quantum Electron., 46(8), 1206-1213 (2010).

R. Kou, et al., "High-Gain, Wide-Dynamic-Range Parametric Interaction in Mg-Doped Linbo3 Quasi-Phase-Matched Adhered Ridge Waveguide", Opt. Express 19(12), 11867-11872 (2011).

M. Chauvet, et al., "High Efficiency Frequency Doubling in Fully Diced Linbo3 Ridge Waveguides on Silicon", J. Opt. 18 (085503), (2016).

G. D. Boyd, et al., "Characteristics of Metal-Diffused Linbo3 for Acoustic Devices", J. Appl. Phys. 48(7), 2880-2881 (1977).

W. Tsai, et al., "Time and Temperature Dependent Study of Zn and Ni Codiffused Linbo3 Waveguides", J. Light. Technol. 33(23), 4950-4956 (2015).

E. Cantelar, et al., "Single Polarized Tm3+ Laser in Zn-Diffused Linbo3 Channel Waveguides", J. Appl. Phys. 86(161119), (2005).

R. Twu, et al., "Zn Indiffusion Waveguide Polarizer on a Y-Cut Linbo3 At 1.32-Mm Wavelength", IEEE Photonics Technol. Lett., 12(2), 161-163 (2000).

W. M. Young, et al., "Photorefractive-Damage-Resistant Zn-Diffused Waveguides in Mgo: Linbo3", Opt. Lett., 16(13), 995-997 (1991).

W. M. Young, et al., "Fabrication, Characterization and Index Profile Modeling of High-Damage Resistance Zn Diffused Waveguides in Congruent and Mgo:Lithium Niobate", J. Light. Technol. 10(9), 1238-1246 (1992).

L. Ming, et al., "High Conversion Efficiency Single-Pass Second Harmonic Generation in a Zinc Diffused Periodically Poled Lithium Niobate Waveguide", Opt. Expres 13(13), 4862-4868 (2005).

C. Wang, et al., "Ultrahigh-Efficiency Wavelength Conversion in Nanophotonic Periodically Poled Lithium Niobate Waveguides," Optica 5, 1438-1441 (2018).

H.E. Major, et al., "Gouy Phase Compensation in Quasiphase Matching", Optics Communications, 281(19) (2008).

International Search Report and Written Opinion of the International Searching Authority for corresponding International Patent Application No. PCT/GB2020/051459, dated Sep. 2, 2020.

Toshiaki Suhara, "Waveguide Nonlinear-Optic Wavelength Conversion Devices and Their Applications," pp. 137-150, Jan. 1, 2005, XP55721535, Retrieved from the Internet, URL: https://citeseerx.ist.psu.edu/viewdoc/download?doi=10.1.1.503.8479&rep=rep1&type=pdf.

Jayaraman Senthil Selvan, et al., "Fabrication of Zn-Indiffused LiNbO 3 Optical Waveguides Using ZnS as Diffusion Source," Japanese Journal of Applied Physics, vol. 44, No. 5A, May 10, 2005, pp. 3075-3076.

Lei Wang, et al., "Quasi-phase-matched frequency conversion in ridge waveguides fabricated by ion implantation and diamond dicing of MgO: LiNbO3 crystals," Optics Express, vol. 23, No. 23, Nov. 10, 2015, p. 30188.

L. G. Carpenter, et al., "Ductile dicing of LiNbO3 ridge waveguide facets to achieve 0.29 nm surface roughness in single process step." Electronics Letters, IEE Stevenage, GB, vol. 53, No. 25, Dec. 7, 2017, pp. 1672-1674.

Search Report under Section 17 of the GB Intellectual Property Office for corresponding GB Application No. 1908764.2, dated Dec. 17, 2019.

\* cited by examiner

METHOD FOR FABRICATION OF RIDGE WAVEGUIDES

This application is a national phase of International Application No. PCT/GB2020/051459 filed Jun. 17, 2020, which claims priority to United Kingdom Application No. 1908764.2 filed Jun. 19, 2019, the entire disclosures of which are hereby incorporated by reference.

BACKGROUND OF THE INVENTION

The present invention relates to a method for the fabrication of ridge waveguides, and ridge waveguides fabricated using the method.

Quasi-phase matching (QPM) is a well-established technique for generating optical wavelengths using wavelength conversion provided by nonlinear optical interactions such as second harmonic generation and optical parametric generation. In contrast with conventional phase matching to support nonlinear processes, QPM utilises engineered nonlinear materials in which the phase matching capability is tailored for a desired interaction by manipulation of the material's crystal domain structure into a periodic arrangement known as periodic poling. QPM therefore has the potential to generate virtually any desired wavelength, and so is particularly useful for creating light at wavelengths where laser sources do not operate or are difficult to produce, or for unusual applications where the volume of lasers sold does not allow for economies of scale. A number of QPM materials have become commercially available including periodically poled lithium niobate (PPLN), periodically poled lithium tantalate (PPLT), periodically poled potassium titanyl phosphate (PPKTP) and, more recently, orientation patterned gallium arsenide (OPGaAs). It is common to modify these materials by adding dopants to improve optical properties. For example, it is known that adding magnesium oxide (MgO) to lithium niobate at a level of around 5% improves resistance to photorefractive damage [1].

QPM materials are typically used in one of two formats. Bulk crystals can be used, in which focused light propagates freely, typically through a tight focus, to create the high optical intensities that are required for nonlinear interactions. Alternatively, it is possible to create an optical waveguide structure within the material, where a higher refractive index region confines and guides light by total internal reflection (referred to as wave guiding), in a mechanism analogous to the operation of an optical fibre.

A number of alternative approaches have been demonstrated for defining waveguides in lithium niobate (LiNbO$_3$) by forming a region of increased refractive index. These include titanium diffusion and proton exchange [2, 3]. However, these methods have known issues when used with PPLN, including increased photorefractive damage in the case of titanium diffusion, and limited device lifetime/stability due to a low initial fabrication temperature in the case of proton exchange [4, 5]. These features make such waveguides unsuitable for use at relatively high, and desirable, optical power levels (up to watts or even tens of watts of input laser light). Other routes for making PPLN waveguides include bonding of materials followed by dicing of waveguide channels using precision dicing equipment, which allows for the creation of smooth optical sidewalls that reduce scatter loss [5, 6, 7]. Other approaches make use of other dopants for diffusion, including zinc, nickel and hafnium [8-13]. A particular example is that of zinc diffused waveguides formed using metallic zinc to create diffused waveguides by applying the zinc as thin strips which can then be diffused to create channel waveguides [14, 15]. This intrinsically creates a channel waveguide so there is no need for dicing, but issues with overlap between the modes of the fundamental wavelength and the nonlinearly generated wavelength(s) in the conversion interaction can limit efficiency. Furthermore, for efficient operation it is beneficial to match the optical mode guided by the waveguide to that of an input mode, often from an optical fibre, and this can be difficult, not least in trying to match the symmetry of the guided modes to that of the fibre. A final alternative, often called ion slicing, makes use of hydrogen ion bombardment followed by bonding and then separation of the material and further dry etching [16].

Nonlinear optical devices created in MgO-doped lithium niobate can have attractive power handling capabilities and photorefractive resistance, and can be used at room temperature, rather than the 150° C. or higher temperatures typically required for the operation of undoped PPLN devices. Commercial MgO PPLN waveguides are sold by a number of companies, and manufactured using a wide variety of the above-mentioned techniques.

As noted, QPM devices can enable the generation of wavelengths that are otherwise unavailable or impractically available from existing optical sources. Applications of such wavelengths include cold atom spectroscopy/atom trapping/atom sensing, in which a number of laser wavelengths are needed around 780 nm at 1 W power levels, potentially for use in challenging environments such as space satellites where long laser lifetime, narrow linewidth, good electrical-to-optical efficiency, and low size and weight are all important parameters. An option would be to use a direct semiconductor laser for each wavelength, but this has a number of associated challenges, such as development time and cost, achieving suitable power versus linewidth requirements, and achieving standardised performance across multiple devices. A more practical approach is to make use of proven optical telecommunications technology operating around 1560 nm for which high performance lasers, optical amplifiers, modulators, isolators and low-loss components are all available at attractive prices and with appropriately long service lifetimes. The 1560 nm light can be frequency-doubled via second harmonic generation in a QPM device to wavelengths in the 780 nm region required for cold atom use. Accordingly, methods for the fabrication of high quality nonlinear optical waveguides, with good overlap to optical fibre modes, high conversion efficiency, power handling at the watt level, and using manufacturing techniques that are scalable and repeatable are of interest.

SUMMARY OF THE INVENTION

Aspects and embodiments are set out in the appended claims.

According to a first aspect of certain embodiments described herein, there is provided a method for fabricating an optical waveguide, the method comprising: providing a sample of lithium niobate doped with magnesium oxide and having at least one grating of periodic domain inversion defined therein; applying a layer of metallic zinc to a surface of the sample over the at least one grating using sputter deposition; heating the sample in an atmosphere of pure oxygen to cause the zinc to indiffuse into the lithium niobate to form a waveguiding layer of increased refractive index under the surface of the sample; and using a dicing blade to cut two substantially parallel channels along a length direction of the at least one grating, to define a ridge waveguide between the two channels.

According to a second aspect of certain embodiments described herein, there is provided a ridge optical waveguide or a device comprising a ridge optical waveguide fabricated using a method according to the first aspect.

According to a third aspect of certain embodiments described herein, there is provided an optical device comprising at least one ridge waveguide formed in periodically poled lithium niobate doped with magnesium oxide, the at least one ridge waveguide defined between two substantially parallel channels cut into the periodically poled lithium niobate along an optical propagation direction of the periodic poling by a dicing blade, and the periodically poled lithium niobate having an indiffused layer of zinc to provide optical confinement in the at least one ridge waveguide in a direction orthogonal to the optical propagation direction and to a width of the at least one ridge waveguide defined by a spacing of the parallel channels.

These and further aspects of certain embodiments are set out in the appended independent and dependent claims. It will be appreciated that features of the dependent claims may be combined with each other and features of the independent claims in combinations other than those explicitly set out in the claims. Furthermore, the approach described herein is not restricted to specific embodiments such as set out below, but includes and contemplates any appropriate combinations of features presented herein. For example, method and device may be provided in accordance with approaches described herein which includes any one or more of the various features described below as appropriate.

BRIEF DESCRIPTION OF THE DRAWINGS

For a better understanding of the invention and to show how the same may be carried into effect reference is now made by way of example to the accompanying drawings in which.

DETAILED DESCRIPTION

Aspects and features of certain examples and embodiments are discussed/described herein. Some aspects and features of certain examples and embodiments may be implemented conventionally and these are not discussed/described in detail in the interests of brevity. It will thus be appreciated that aspects and features of devices and methods discussed herein which are not described in detail may be implemented in accordance with any conventional techniques for implementing such aspects and features.

It is proposed herein to manufacture optical waveguides in periodically poled lithium niobate (PPLN) doped with magnesium oxide via a series of steps which enables the production of waveguides in which high nonlinear optical conversion efficiencies at the watt power level are achievable in combination with high launch efficiencies from optical fibres delivering input light for the waveguide. The fabrication technique is tolerant to variability in the process steps, and intrinsically in the optical properties of the waveguide, thereby offering a reproducible, reliable and robust manufacturing route for waveguide fabrication.

In particular, the fabrication method uses different and separate techniques to provide the optical mode confinement needed for waveguiding in the vertical and horizontal directions. Each of these stages can thereby be optimised in order to provide a good quality waveguide able to support wavelength conversion at high power levels and with high efficiency.

The waveguides are formed in a substrate or wafer of magnesium oxide-doped PPLN, the wafer typically having a plurality of poled regions, or gratings, each of which can be formed into an individual and separate waveguide or waveguiding device. In the examples, the waveguides are engineered for quasi-phase matching (QPM) to generate an output at a wavelength around 780 nm by second harmonic generation from an input wavelength around 1560 nm. The QPM is initially engineered by appropriate selection of the periodic poling dimensions in the usual manner, and the quality and efficiency of the supported conversion interaction is provided by refinement of the various processing steps applied to the wafer in order to define the waveguides. A layer of metallic zinc is diffused into the PPLN in order to modify the refractive index of a layer of the PPLN adjacent to the wafer surface; this provides optical confinement in the vertical direction, or orthogonal to the plane of the wafer. Then, channels are cut along the gratings using a dicing blade. The portions of PPLN remaining between adjacent channels form ridge waveguides, in which optical confinement in the horizontal direction, parallel to the plane of the wafer, is provided by the refractive index difference at the boundary between the PPLN and the surrounding air.

Figure 1:
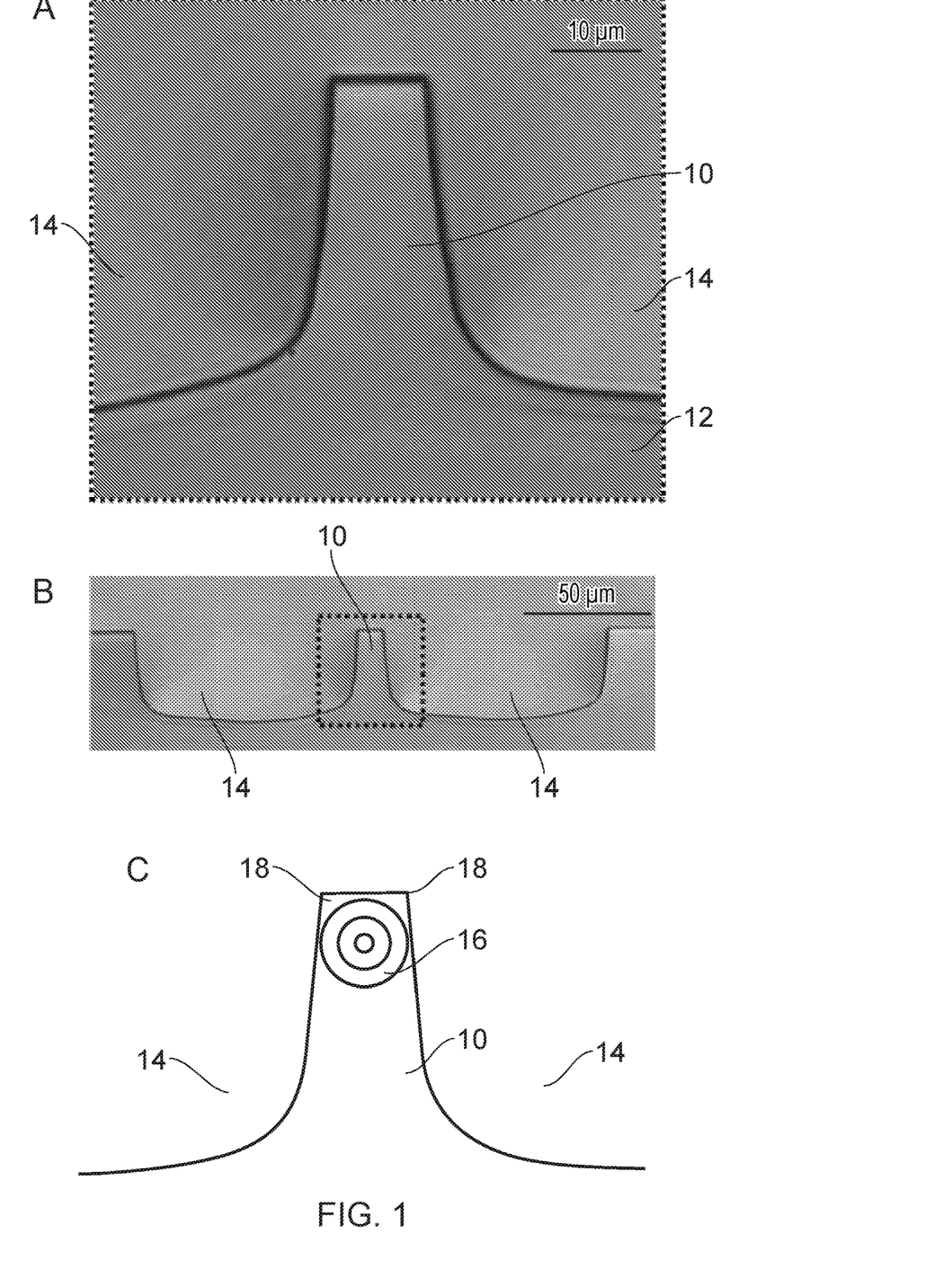
FIGS. 1A and 1B show optical microscope images at different magnification levels of the end view of a ridge waveguide fabricated according to a method of the disclosure.
FIG. 1C shows a schematic end view of ridge waveguide, with a propagating optical mode indicated.

FIG. 1A shows an optical microscope image of the end view of a ridge waveguide 10 formed on a wafer or sample 12 of PPLN using a method as disclosed herein. The waveguide can carry light along a propagation direction orthogonal to the plane of the page, and provides QPM by virtue of a periodically poled structure comprising periodic reversals of the crystal domains in the lithium niobate arranged along the propagation direction. The side walls of the ridge 10, which are nearly vertical, are formed by channels 14 cut with precision wafer dicing apparatus on either side of the ridge 10, and are smooth. Scattering losses of light propagating along the waveguide are therefore low, so that optical confinement in the horizontal plane is good.

FIG. 1B shows an optical microscope image of the end view of the ridge waveguide 10 at a lower magnification level (the area shown in FIG. 1A being indicated by the dashed box). The two channels 14 can be seen; these are cut to extend parallel to one another along the length of the grating, i.e. along the intended propagation direction and into the plane of the page, in order to define the ridge 10 between them. The separation or spacing of two adjacent channels is chosen to given a waveguide of a particular desired width.

FIG. 1C shows a simple schematic representation of the ridge waveguide of FIGS. 1A and 1B, with an indication of the position and shape of the optical mode 16 which can be supported from propagation in the ridge waveguide 10. The zinc layer resides in the upper part of the wafer only, extending downwardly from the surface, and hence provides optical confinement in a top portion of the ridge 10. The neat, square corners 18 of the ridge structure, provided by use of the dicing blade to cut the channels 14, also help to shape the optical mode 14. Accordingly, single mode propagation is supported, with a substantially circular Gaussian profile.

Figure 2:
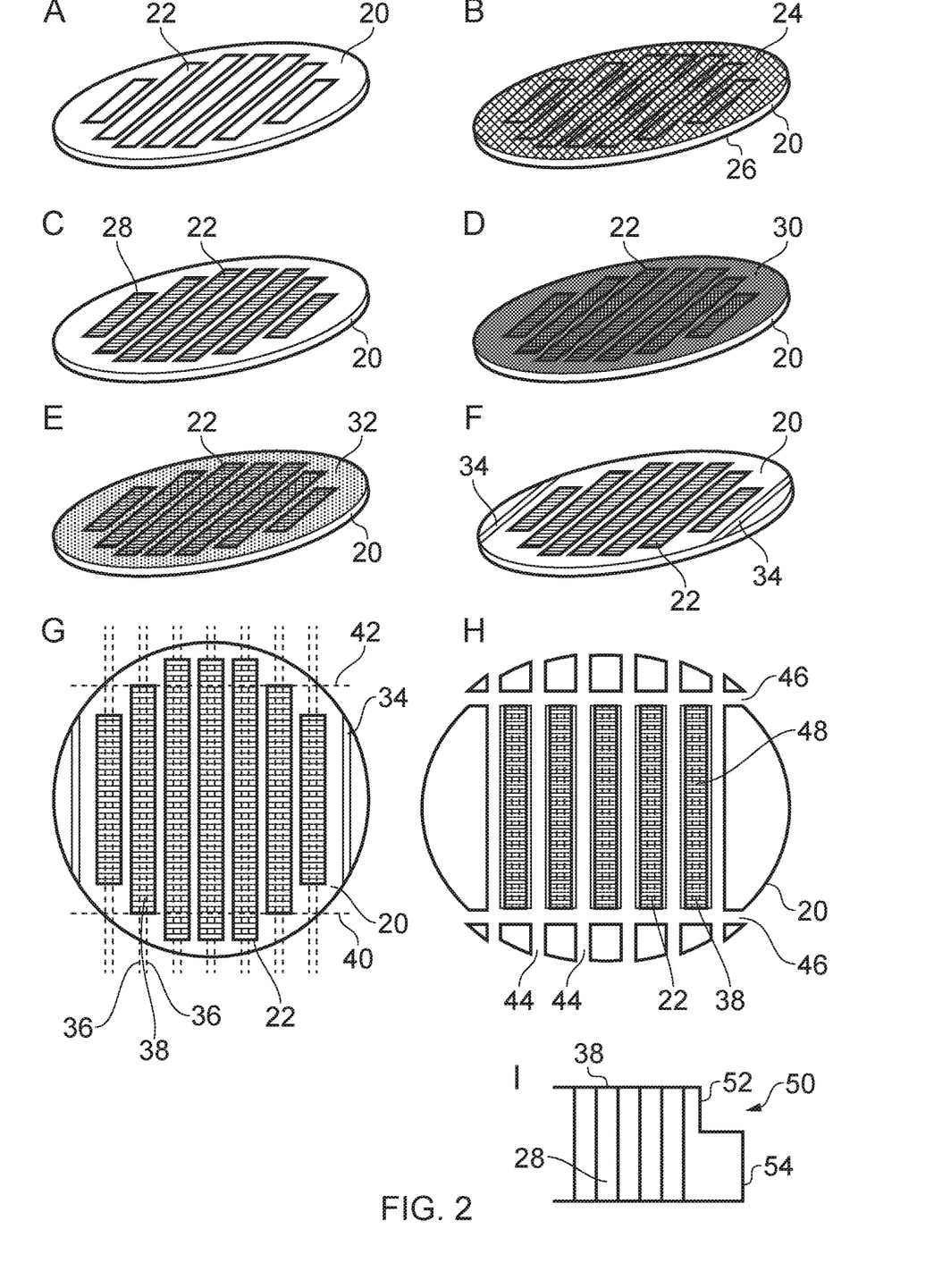
FIGS. 2A-2F show perspective schematic views of a wafer processed according to steps in a method of disclosure.
FIGS. 2G and 2H shows plan schematic views of the wafer processed according to next steps in the method.
FIG. 2I shows a schematic side view of an end of a ridge waveguide following the step of FIG. 2H.

FIG. 2 shows a series of schematic representations of a wafer at various stages of an example fabrication method according to the present disclosure.

FIG. 2A shows a perspective view of a wafer 20 (also referred to herein as a sample; note the sample need not be a conventional wafer) to which the method is to be applied to make one or more ridge waveguides for QPM. The wafer 20 is typically 75 mm in diameter, although 100 mm wafers are also used. Also typically, the surfaces of the wafer are the +z and −z faces of the lithium niobate crystal. The wafer 20 is formed from lithium niobate doped with magnesium oxide (MgO). A doping level of 5% MgO can provide a useful improvement in the resistance of lithium niobate to photorefractive damage, but other doping levels may be used. Also, other or additional dopants may be added to the lithium niobate if preferred, in order to tailor the optical properties of the lithium niobate. Within the wafer, a plurality (in this example seven, but the invention is applicable to any number from one upwards) of gratings 22 are defined, where each grating 22 comprises a periodic inversion, or poling, of the domain structure of the lithium niobate crystal for the purpose of supporting quasi-phase matching, in the known manner. Hence, the gratings 22 comprise magnesium oxide-doped periodically poled lithium niobate (MgO:P-PLN). The gratings 22 comprise a plurality, in sequence along an intended optical propagation direction, of ferroelectric domains with periods designed to phase match a desired nonlinear interaction, in this case, second harmonic generation. Commonly, the grating structure is a simple "+−+−+−" sequence of equally sized and oppositely oriented domains, although this is not essential, and the approaches for created apodised structures to control the spectral shape and temperature acceptance bandwidth can be used to define the grating [17]. During the method, each grating 22 is provided with at least one ridge waveguide, and each grating 22 can finally form an individual waveguiding device by separating it from the rest of the wafer 20. Hence, an individual wafer can yield a plurality of devices. The gratings 22 can extend across a large proportion of the width of the wafer 20, and the quality of waveguide achievable by the present method allows the full grating length to be retained into the finished device; this contributes to a high nonlinear wavelength conversion efficiency.

The poled grating structure may be produced in any known manner, such as by electric field poling [18]. For example, the gratings 22 on the wafer 20 may all have the same period, and may be produced using a photolithographic process. The wafer is patterned with photolithographic resist in pattern corresponding to the desired grating pattern, covered in a conductive gel, and placed between a set of electrodes. Pulses of high voltage are subsequently applied to create nucleation sites. After pulsing, the high voltage signal is applied without modulation until the leakage current through the wafer tends to steady state, thereby forming crystal domain inversion in the regions unmasked by the photoresist. The conductive gel is then removed from the wafer with deionized water, and the wafer cycled through an acetone, isopropyl alcohol, and deionized water sonication for twenty minutes per solvent.

The dimensions of the periodic poling can be defined based on prior experimentation and calculation. The actual phase matching parameters of a given waveguide, which comprise a temperature at which phase matching takes place for a given set of wavelengths, are directly related to the effective refractive indices of the optical modes at each wavelength, and thus to the material parameters of the wafer (such as the MgO doping level, and crystal growth parameters used to make the wafer). In the present case, the phase matching properties also depend on the profile and concentration of the indiffused zinc layer and to the physical dimensions of the ridge waveguide, as will be discussed further below.

FIG. 2B shows a next step in the process. For optimum waveguiding and phase matching, it is important for the channels which define the sides of the ridge waveguide to be correctly positioned with respect to the grating. Hence, it is useful to be able to correctly identify the location and orientation of a grating within the wafer, so that the channel position can be properly registered with the grating position. In an embodiment, it is proposed to etch the wafer on one side only in order to reveal the QPM grating structure, thereby enabling later precise alignment with the ridge definition channel cutting procedure step. FIG. 2B shows a mask of adhesive tape 24 applied to the +z face of the wafer 20 (the −z face could alternatively be used) to protect this surface during the etching, which is achieved by immersing the wafer 20 in a bath of concentrated hydrofluoric acid solution in order to etch the unmasked −z face 26 of the wafer 20. The face protected by the mask of tape 24 is intended to be the wafer surface to which later steps in the method are applied; the protection preserves the wafer surface from roughness introduced by the etching, which can make later processes less effective. Other approaches could be used to locate the gratings; this include depositing a protective photoresist to protect one surface of the wafer during the etching, or using different etchants. Alternatively, alignment marks showing or otherwise indicating the grating position could be created on the wafer, for example by laser ablation before or after the poling process, in which case the etching step is not necessary.

FIG. 2C shows a next step in the process, which is a cleaning process, applied to improve the quality of the following step and therefore not essential. The wafer 20 is shown after being cleaned. The cleaning is preferably carried out in a cleanroom facility, for example complying with ISO 6. Wet chemical cleaning with fuming nitric acid and deionized water is employed to remove organic material and particles from the wafer surfaces, in order to provide a clean surface for subsequent zinc deposition. FIG. 2C shows the wafer with the +z face uppermost ready to receive the zinc; recall that this face was protected from the etching so the grating structure is not revealed on this surface. However, the domain boundaries 28 of the poled structures are shown in FIG. 2C for clarity.

FIG. 2D shows the result of a next step in the process, being a thin film deposition step for applying a layer or thin film of metallic zinc 30 (as opposed to zinc oxide, ZnO) to a surface of the wafer 20, in this example the +z face but this is not limiting. In the illustrated example, the layer of zinc 30 is applied uniformly (i.e. to substantially the same thickness at all points) across the whole surface of the wafer 20. This is a convenient way to form the zinc layer 30 at each required location, namely over each grating 22, but is not essential. Rather, it is appropriate merely than the zinc layer 30 be applied over each grating, and conveniently, this can be achieved by coating the whole surface of the wafer. Alternatively, masking might be used to screen regions of the wafer surface lying around and between the gratings 22 so that zinc deposition is limited to areas of the gratings only.

Preferably, the metallic zinc is laid down using a physical vapour deposition sputtering technique capable of depositing pure metallic layers. Thin film deposition of zinc via sputtering is most successful following careful setting up of the sputtering apparatus. In order to ensure that a layer of metallic zinc is deposited without reacting with oxygen or other volatiles, a vacuum approaching $10^{-7}$ or $10^{-8}$ mTorr is preferably provided in the deposition chamber. The sputtering target comprising metallic zinc is loaded into the chamber, and before the deposition process starts, a layer of zinc oxide which will have formed on the target surface must be removed to ensure that the desired metallic zinc is deposited. For this, target conditioning with an argon plasma can be used. One or more test wafers can then be coated to allow the zinc deposition thickness uniformity to be checked before sputtering onto the wafer 20 is performed. The thickness uniformity is preferably within RMS ±10%. In an example, a layer of metallic zinc 30 with a thickness of 100 nm is sputtered onto the surface of the wafer 20 using argon plasma. In actuality, a plurality of wafers can be provided with a metallic zinc layer in a single operation of the sputtering apparatus.

FIG. 2E shows the wafer 20 after a next step of the method which is a diffusing step to indiffuse the metallic zinc into the lithium niobate of the wafer in order to increase the refractive index and form a waveguiding layer. After the diffusing step, the wafer 20 has zinc indiffused into a layer 32 extending downwardly from the surface to which the metallic zinc layer 30 was applied. The indiffusion is caused to happen by heating the wafer 20. This can be performed, for example, in a tube furnace. A pure oxygen atmosphere is used within the furnace, rather than air, since this provides reduced surface roughness of the wafer after indiffusion. A smooth surface reduces propagation loss via scattering in the finished waveguide. To perform the heating, the furnace can be run to the required processing temperature without the wafer but with wafer boats, in order to check that the process temperature is within ±1° C. of a target temperature for the indiffusion (the indiffusion temperature is discussed in more detail below). Preferably, the temperature in the process zone of the tube furnace also only varies by this amount. A useful duration for the indiffusion is to heat the wafer at the desired indiffusion temperature, for example 945° C., for one hour. This follows an initial ramping of the temperature to reach the target indiffusion temperature at an appropriate rate, and with an appropriate flow of oxygen, which is sufficient to oxidise the metallic zinc layer. Oxidation of the zinc is important since this is what reduces the wafer surface roughness, and hence roughness of the topside of the final ridge waveguides, thereby reducing scatter, as noted above. Moreover, removal of all the metallic material (by converting it to an oxide) avoids optical absorption at certain polarisations during operation of the finished waveguide. At the end of the indiffusion period, the wafer is returned to room temperature before being removed from the furnace.

The zinc indiffusion creates a planar optical waveguide, in other words, a waveguiding layer, which is parallel to the plane of the wafer and thereby constrains a propagating optical mode in the vertical direction. The waveguiding layer extends a short distance into the wafer material, and does not reach through the full thickness of the wafer.

In order to complete the waveguiding structure, it is necessary to constrain the optical mode in the horizontal direction also, by breaking the waveguiding layer into one or more waveguiding strips, in order to direct propagating light along the periodically poled grating so that it can undergo the desired wavelength conversion. According to the method, this is done by cutting channels into the waveguiding layer to form and define a ridge between adjacent channels, resulting in a ridge waveguide that confines light in both directions. It is proposed to achieve this by using a precision dicing technique to saw smooth grooves into the wafer to define the ridges. The ridges could alternatively be formed by using wet etching, dry etching or laser machining. However, dicing is preferable because it delivers sidewalls for the ridges/channels which have very low surface roughness, on the nanometre scale, thereby giving minimal scattering loss for light propagating in the waveguide. Also, the dicing can be performed and controlled with sufficient accuracy to achieve a variation in the width of the ridge over a 40 mm long waveguide of less than 200 nm. This very low error in the width, and corresponding high consistency provides low loss and uniform operation over the length of the waveguide, contributing to high operating powers and conversion efficiencies.

FIG. 2F shows the wafer after a next step in the process, which is not essential but if carried out contributes to the accuracy of cutting the channels and the corresponding accuracy in ridge width. The step comprises the cutting of one or more test channels or grooves 34 in unwanted parts of the wafer 20, such as edge portions lying outside the area within which the gratings 20 are located. The test channels 34 are cut, or diced, using the same dicing apparatus and dicing blade which will be used to cut the channels that will define the ridges. The term "dicing" refers to the fact that the apparatus is intended for the dicing of wafers, which is cutting of a wafer into smaller parts after processing in order to separate or singulate individual devices from a plurality that have been formed on a wafer, for example individual electronic or optoelectronic components formed on a semiconductor wafer. In the present case, however, the cuts do not pass through the wafer, but instead extend only part of the way through the wafer thickness in order to make the desired channels or grooves.

Initially, the dicing blade can be prepared by dressing it in order to reduce static runout, thus creating smooth rotation of the blade with less procession, and hence more accurate cutting of the desired size of channel. Dressing also removes any dull cutting diamonds from the blade's binder. Then, the test channels 34 are cut into the surface of the wafer, on the side containing the waveguiding layer formed by the indiffused zinc, and using the dressed dicing blade. Typically, one, two, three or four test channels can be made. The purpose of the test channels is to enable calibration of the channels which will be cut to form the ridge waveguide. For example, owing to factors such as variations in wafer dimensions, the mounting of the wafer on the dicing apparatus and performance changes of the blade over its lifetime, the width of a cut channel may vary by as much as 5 μm from expectations. Once the test channels are cut, their widths are measured at several positions along the length of each test channel, and these measurements are used to calculate an average width of channel which the dressed blade is cutting. This average width can then be used to determine the positioning of each adjacent pair of channels which are to be cut to form a ridge, in order to produce a ridge of a desired width. The ridge width is its dimension orthogonal to the direction of optical propagation along the ridge waveguide. To improve accuracy, the wafer is retained in place (in situ) in the dicing machine or apparatus while the measurements are made. Conveniently, therefore, the test channels can be cut parallel to the intended direction of the ridge-defining channels in order to avoid the need to rotate the wafer relative to the blade between the test cuts and the process cuts, thereby minimising disruption and maximising accuracy.

Note that, while the cutting and measurement of test channels as described above improves the quality of the final waveguide by allowing the ridge width to be more accurately defined, this stage of the process may be omitted. For example, if the operation of the dicing machine and the quality of the blade are known to give a sufficiently consistent result, or a greater tolerance in the ridge width can be accommodated, then previously obtained or established information about the cutting width of the dicing blade can be used to position the ridge-defining cuts, without the need to perform the test cut forming stage for every wafer which is processed.

FIG. 2G shows the result of a next step in the method, in which the ridge waveguides are formed. The wafer 20 is shown in plan view now. In a first stage, each grating 20, still in situ following the cutting of the test channels 34, is processed by the cutting of two channels 36. The channels 36 run along the length of the grating 20, parallel to the length direction and orthogonal to the boundaries between the periodically poled domains. The removal of wafer material by the cutting of the channels 36 allows a ridge 38 to be formed, defined by the material remaining between the channels 36. The channels 36 are appropriately positioned and spaced apart in order to form a ridge 38 of a desired width, based on the average test channel width determined as described in conjunction with FIG. 2G. The two channels 36 are parallel to one another in order to provide a ridge with a constant width, in order to provide good optical performance. The side wall of the channels 36 are also the side walls of the ridge 38, formed with a high level of surface smoothness by the dicing blade.

In this example, two channels 36 have been cut for each grating 22, thereby creating a single ridge waveguide in each grating. In other examples, described further below, two or more ridge waveguides can be formed per grating, by the cutting of additional parallel channels extending along the length of the grating. The wafer material remaining between any two pairs of channels 36 can be designated as a ridge waveguide, if it is of an appropriate width for the intended optical use.

In a second stage, the wafer 20 is rotated in the dicing machine in order to allow the cutting of further channels orthogonal to the previous channels 36, and hence also orthogonal to the length of the gratings 22 and the ridge waveguides 38. A first further channel 40 is made across the wafer 20 and through the ridges 38 near, in line with, or through first ends of the gratings 22, and a second cut 42 is made across the wafer 20 and through the ridges 38 near, in line with, or through second ends of the gratings 22. These cuts 40 and 42 create smooth end facets for the waveguides, comprising an input facet at one end of a grating 22 and an output facet at the opposite end of the grating 22. The use of the dicing blade to create the end facets gives a smooth surface which is suitable for low loss coupling of light into and out of the waveguide without any need for further processing such a polishing, which would be very difficult to successfully carry out on the ridged structure.

In common with the test channels 34 and the ridge-defining channels 36, the facet-defining channels 40, 42 are cut only part of the way through the thickness of the wafer 20. Usefully, though, the facet-defining channels 40, 42 can be cut to a greater depth than the ridge-defining channels 36. For example, if the ridge-defining channel depth is in the range of about 30 μm to 60 μm, the facet-defining channels 40, 42 can be about 150 μm.

FIG. 2H shows the result of a final stage in the example method, in which the wafer is singulated into individual devices or chips, each comprising at least one ridge waveguide. The same dicing blade or a different dicing blade or dicing apparatus can be used for the singulation. A series of parallel cuts 44 through the full thickness of the wafer 20 are made, one between each pair of adjacent gratings 20, each of which now supports one or more ridge waveguides 38. This separates each grating 20 from its neighbours, and removes waste material from the edges of the wafer 20. Additionally, further cuts 46 are made, in the vicinity of each of the facet-defining cuts 40, 42. This removes waste material from the ends of devices/chips 48.

The further cuts 46 could be made along the line of facet-defining cuts 40, 42. However, it has been found useful to offset the further cuts slightly in an outward direction, in other words closer to the edge of the wafer. This creates a step in the end surfaces of a device, with a portion of material from the lower part of the wafer thickness protruding beyond the planes of the end facets. This can make for improved ease of handling of a device, and provide some protection for the end facets.

FIG. 2I shows a schematic side view of an end of a device 50. The ridge waveguide 38 includes the periodically poled structure 28 running sequentially along its length and the direction of optical propagation. The device 50 has an end facet 52 for the input or output of light, with an offset, protruding handling surface 54 below.

After singulation, the chips can be washed over with deionized water in order to remove debris from the dicing. The chips can then be spun and dried with nitrogen. The end facets can be provided with antireflection coatings for the intended wavelengths of operation after additional cleaning in deionized water to a cleanroom standard. As an alternative, the cuts to create the end facets and the further cuts to remove the waste material from the ends of the chips may be made at an angle to the length of the grating, in other words not substantially orthogonal to the parallel cuts. Appropriately angled facets can suppress Fresnel reflections without the need for antireflection coatings.

Experiments have been performed in order to ascertain appropriate values for various of the parameters used in the method described with respect to FIG. 2, in order to optimise waveguide performance for the example of second harmonic generation from 1560 nm input light. In particular, the performance depends on the geometry of the waveguide, which is defined by depth and density of the indiffused zone layer, and the smoothness and positional accuracy of the diced channels. Therefore, to investigate the effects of these characteristics, the geometry was altered by fabricating waveguides using varying indiffusion parameters and with different ridge widths.

The effect of the zinc layer was studied by preparing waveguides from different thicknesses of the deposited metallic zinc layer, and subjecting these to different indiffusion temperatures and times. The resulting planar waveguides (i.e. without the wafers being cut into to define ridge waveguides) were evaluated by measuring their mode field diameters (MFDs). The mode field diameter is an expression or measure of the distribution of optical power per unit area across the end face of a waveguide. Previous work on zinc indiffusion into lithium niobate using deposited zinc oxide has indicated that planar waveguides can be achieved with thicknesses of the deposited zinc oxide layer in the range of 30 nm to 200 nm, indiffusion temperatures of 900° C. to 1100° C. and indiffusion times between 30 minutes to 10 hours [12, 13]. This was used as guidance for the present arrangement, so that metallic zinc layers of four different thicknesses were deposited by sputtering: 50 nm, 100 nm, 150 nm and 200 nm. Stylus profiler measurements verified the thicknesses at RMS ±10% of 16.5%, 5.3%, 2.5% and 5.5% for the four layers, respectively. The indiffusion process was carried out in a tube furnace with a pure oxygen atmosphere. A range of indiffusion temperatures were chosen between 800° C. and 1000° C., with an indiffusion time of one hour. The indiffusion time is the duration for which the furnace is held at the chosen indiffusion temperature (so, the dwell time of the wafer in the furnace at the indiffusion temperature), and excludes the time for ramping up to the indiffusion temperature and the time for cooling to room temperature afterwards.

In order to identify an optimum region in the waveguide fabrication parameter space, the fundamental vertical mode second moment ($1/e^2$ for a Gaussian beam) mode field diameter for each of the planar waveguide layers was measured to find which zinc thicknesses and indiffusion temperatures produced the smallest mode (lowest value of MFD), since smaller modes are expected to give higher nonlinear conversion efficiencies. The MFD was directly interrogated in preference to measuring the refractive index change in the waveguiding layer, because the desired mode is a single mode, and the refractive index variation created by zinc indiffusion is small, roughly only 0.003 [12]. To collect the MFD, an erbium doped fibre amplifier output was injected into the planar waveguide via a cleaved single mode fibre, and light was then collected from the planar waveguide's facet and focused on to an indium gallium arsenide CCD camera. The camera was moved through the diffracted beam and images taken sequentially and fitted to calculate the second moment MFD. The MFD was defined and measured in accordance with the BS EN ISO 11146-1:2005 standard.

Figure 3:
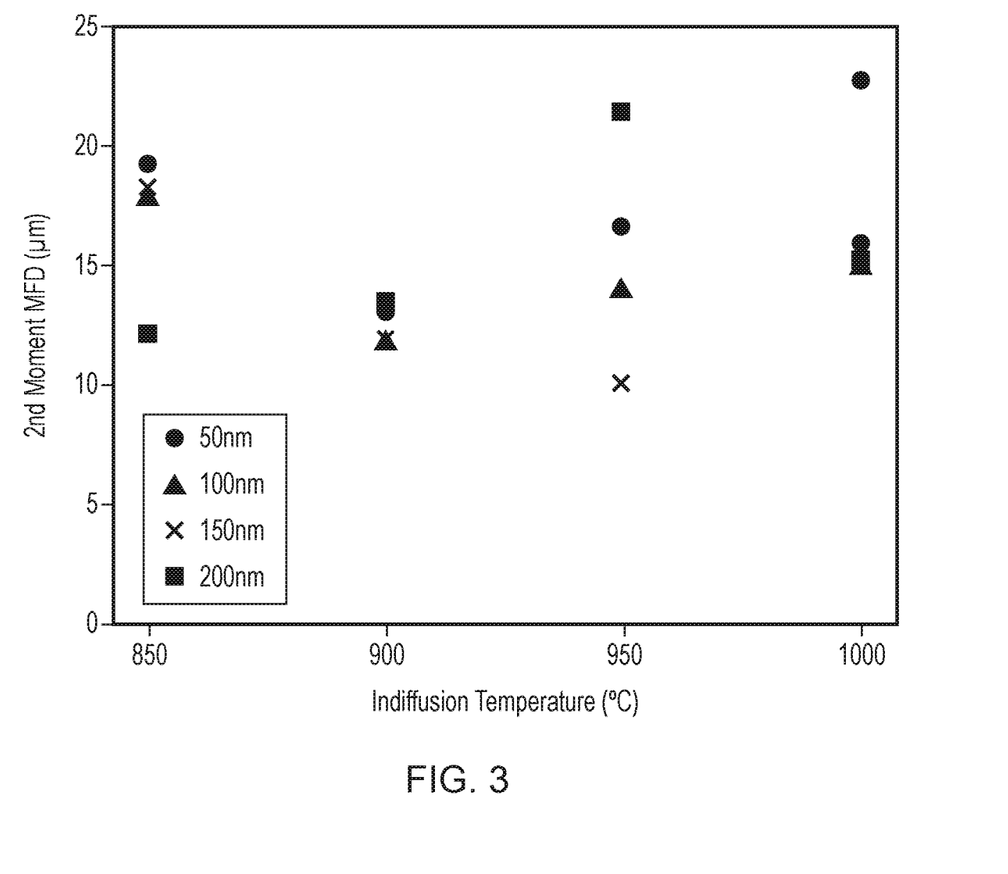
FIG. 3 shows a graph of mode field diameters measured for planar waveguides fabricated according to a method of the disclosure, for various thicknesses of deposited zinc layer and indiffusion heating time used to fabricate the planar waveguides.

FIG. 3 shows a plot of the calculated MFD for each combination of indiffusion temperature (850° C., 900° C., 950° C. and 1000° C. and zinc thickness (50 nm, 100 nm, 150 nm and 200 nm). From this, it can be seen that the smallest MFD, 10 µm, was yielded by the 150 nm thick layer of zinc for an indiffusion temperature of 950° C. For thinner zinc layers and/or the higher indiffusion temperatures the MFD increases as the zinc dopant is spread more extensively through the lithium niobate crystal, supporting a larger mode, or potentially multiple waveguide modes. When the indiffusion temperature was reduced to 900° C. or below, the modes produced were leaky, giving a larger effective MFD as power is lost into the bulk crystal. No waveguiding at all was seen for indiffusion temperatures of only 800° C.

To investigate the zinc diffusion parameters further for the purpose of optimising the process for SHG output, three planar waveguide chips were fabricated into ridge waveguides by cutting appropriate channels with the dicing blade, using the chips from the FIG. 3 experiment that achieved the smallest MFDs. These were 150 nm of zinc indiffused at 900° C., 150 nm of zinc indiffused at 950° C., and a 100 nm of zinc indiffused at 900° C. After forming the ridge waveguides, 26 mm by 5 mm chips were diced, with the PPLN gratings having a period of 18.7 µm to stimulate type-0 SHG at 1560 nm. For each chip, a plurality of ridge waveguides were formed, with widths that varied from 8.5 µm to 13 µm in 0.5 µm increments. The waveguide chips were not antireflection coated. The SHG was measured and evaluated for each zinc thickness, indiffusion time and ridge width. The apparatus for this comprised a tunable seed laser to provide pump light, the output of which was injected into a polarizing maintaining erbium doped fibre amplifier via a polarizer. The light was then coupled into the ridge waveguide by a collimator and an aspheric lens which were matched to achieve a similar mode shape to that of the waveguide. All input (launch) optical components were antireflection coated for the pump wavelength from the seed laser. The pump polarization was optimized to launch TM light by rotating the launch components and minimizing the TE polarization. Light was coupled out of the waveguide and collimated with an aspheric lens and a dichroic filter to separate the pump and signal (the desired SHG) on to a thermal and silicon power sensor. 300 mW of pump light was launched into each waveguide, and the wavelength of the tunable laser varied for phasematching for SHG interaction in the waveguide.

Figure 4:
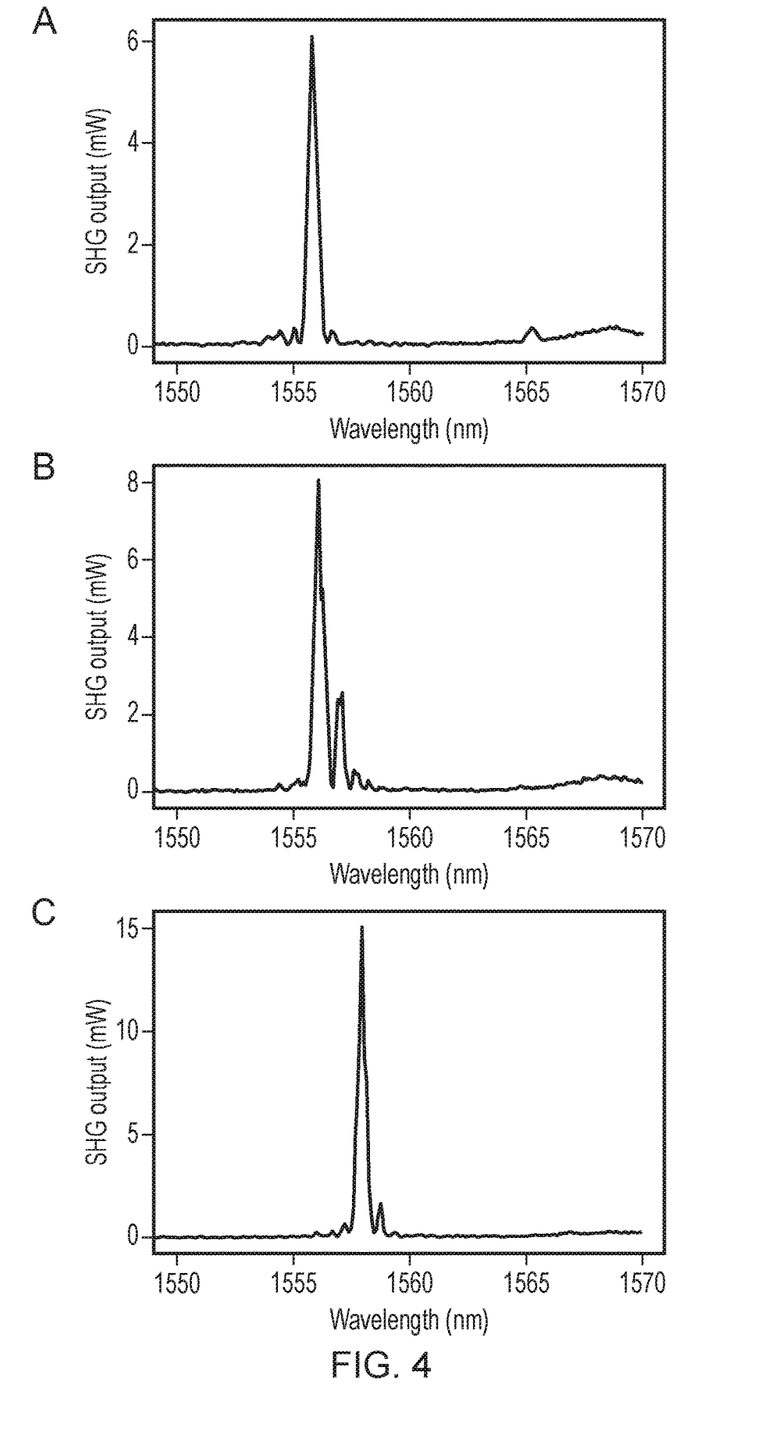
FIGS. 4A, 4B and 4C show graphs of the variation of measured second harmonic generation output power with input pump wavelength for three different ridge waveguides fabricated using a method of the disclosure, for different zinc indiffusion parameters and different ridge waveguide widths.

FIG. 4 shows graphs of some of the results from this experiment. For each chip (and hence each zinc thickness and indiffusion temperature combination), the ridge waveguide width that yielded the highest amount of SHG signal output was identified. FIG. 4A shows a plot of the variation of measured SHG power with input pump wavelength, for a 150 nm zinc layer and a 950° C. indiffusion temperature, for which combination the 12 µm ridge width gave the highest SHG power, 6.2 mW. FIG. 4B shows the corresponding plot for the 150 nm zinc layer and 900° C. indiffusion temperature, for which the 13 µm ridge width gave the highest SHG power, 8 mW. FIG. 4C shows the corresponding plot for the 100 nm zinc layer and 900° C. indiffusion temperature, for which the 13 µm ridge width gave the highest SHG power, 14.5 mW. This is also the highest conversion efficiency measured in the experiment. Interestingly the zinc thickness of 100 nm with an indiffusion time of 900° C. for an hour did not yield the smallest MFD planar mode (see FIG. 3). This is not wholly surprising because the mode overlap between the interacting optical wavelengths, the waveguide loss at these wavelengths, and the effective nonlinearity of the waveguide all affect nonlinear efficiency; the efficiency does not solely depend on the mode size.

In order to investigate if 900° C. was the optimum indiffusion temperature, four further devices were fabricated with 100 nm of Zn and indiffused at a variety of temperatures around the 900° C. to 950° C. temperature range identified from the FIG. 3 experiment, namely 915° C., 930° C., 945° C. and 960° C. A one hour indiffusion time was used in all cases. A plurality of ridge waveguides were cut for each device, with widths ranging from 11 μm to 13 μm in 0.5 μm increments (in correspondence with the most efficient ridge widths of 12 μm and 13 μm identified in the FIG. 3 experiment).

Figure 5:
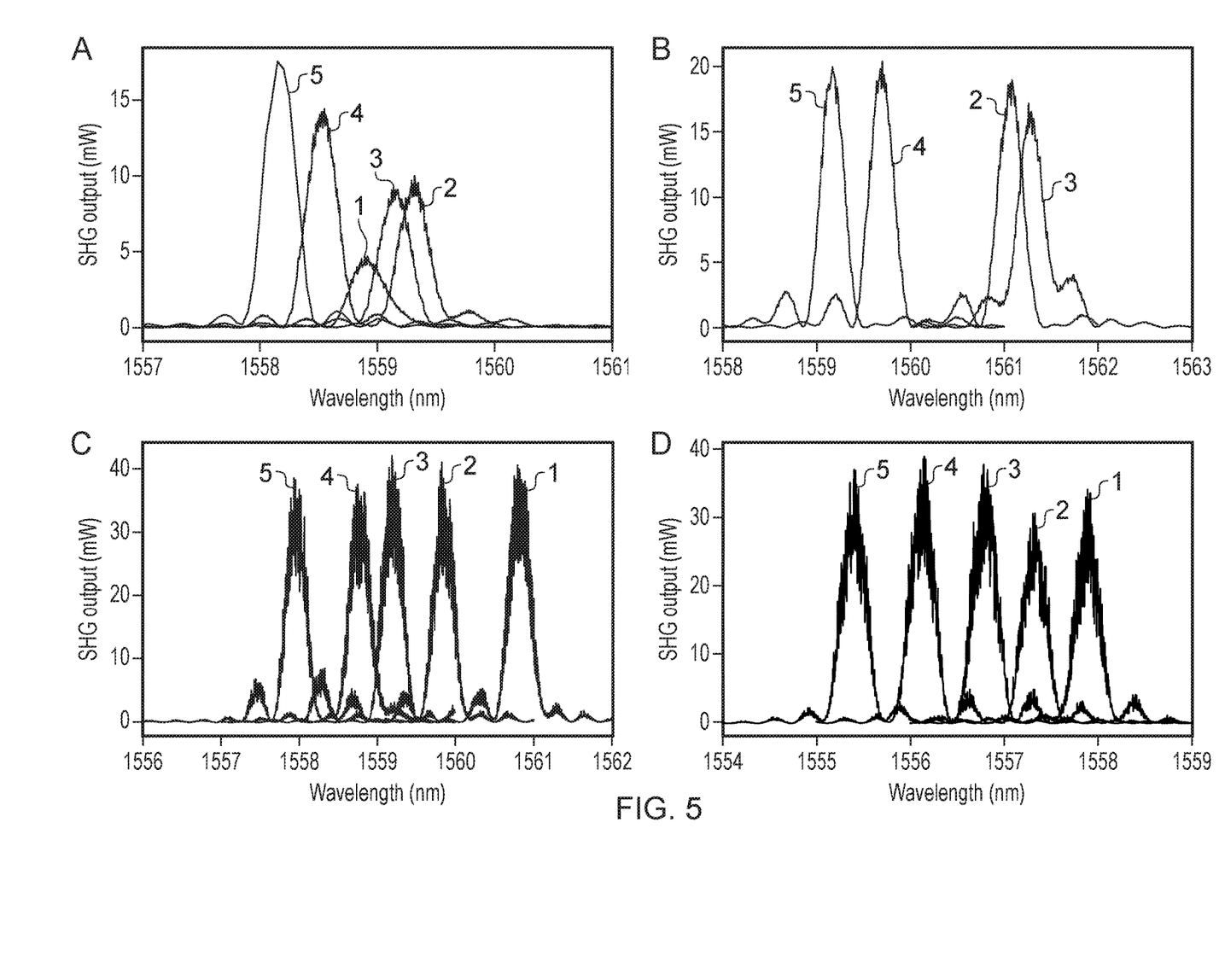
FIGS. 5A, 5B, 5C and 5D show graphs of the variation of measured second harmonic generation output power with input pump wavelength for four sets of ridge waveguides fabricated using a method of the disclosure, each set fabricated at different zinc indiffusion temperatures, and for different ridge widths within each set.

FIG. 5 shows graphs of the SHG output generated for each of the devices, as plots of the SHG output power variation with input pump wavelength (constant pump power in all cases), for each ridge waveguide width. The curves "1", "2", "3", "4" and "5" respectively show the data for ridge widths of 11.0 μm, 11.5 μm, 12.0 μm, 12.5 μm and 13.0 μm. FIG. 5A shows outputs of the ridge waveguides fabricated from the planar waveguide layer indiffused from 100 nm of zinc at 915° C., which produced a maximum SHG output of about 17 mW. FIG. 5B shows outputs of the ridge waveguides fabricated from the planar waveguide layer indiffused from 100 nm of zinc at 930° C., which produced a maximum SHG output of about 20 mW. FIG. 5C shows outputs of the ridge waveguides fabricated from the planar waveguide layer indiffused from 100 nm of zinc at 945° C., which produced a maximum SHG output of about 42 mW. FIG. 5D shows outputs of the ridge waveguides fabricated from the planar waveguide layer indiffused from 100 nm of zinc at 960° C., which produced a maximum SHG output of about 39 mW. From this it is concluded that ridge waveguides produced from a 100 nm layer of zinc indiffused for one hour at 945° C. produced the highest SHG efficiency. Note the introduction of Fabry-Perot fringes with the increased SHG power for the devices indiffused at 945° C. and 960° C., which indicates a reduction in loss of the waveguides at the SHG wavelength, and a corresponding increase in output power.

From these results we can conclude that a metallic zinc layer with a thickness of about 100 nm is particularly useful. Thicknesses near this value, and also larger and smaller thicknesses will also be useful, however, such as a thickness in the range of 95 nm to 105 nm, or 90 nm to 110 nm, or 80 nm to 120 nm, or 70 nm to 130 nm, or 60 nm to 140 nm, or 50 nm to 150 nm, or 50 to 200 nm. Whichever thickness is chosen, however, the layer should be uniform, in other words, its thickness is constant. This facilitates formation of a waveguide with constant vertical structure, to enable low loss waveguiding and efficient nonlinear conversion.

Similarly, we can conclude that an indiffusion temperature at or near 945° C. is particularly useful. Temperatures near this value and also higher and lower temperatures may also be useful, however, such as a temperature in the range of 940° C. to 950° C., or 930° C. to 960° C., or 920° C. to 970° C., or 900° C. to 1000° C., or 850° C. to 1000° C.

An individual ridge waveguide can be defined to have a width of about 11.0 μm, or about 11.5 μm, or about 12.0 μm, or about 12.5 μm, or about 13.0 μm, or in the range of 11.0 μm to 13.0 μm, or 12.0 μm to 13.0 μm, or 11.5 μm to 12.5 μm, or 11.5 μm to 13.0 μm, for example. Other widths are not excluded, however.

A specific example of the fabrication of a ridge waveguide device in accordance with the method outlined with respect to FIG. 2 and parameterised using the results of the experiments discussed with respect to FIGS. 3, 4 and 5 will now be described.

The sample used was a ferroelectric crystal of 1.0 mm thickness z-cut optical grade 5 Mol % Mg doped lithium niobate in a 3 inch (75 mm) diameter wafer format with both z-faces polished to an optical finish. To create the gratings by electric field poling [18], an insulator pattern was applied to the −z face of the wafers in Shipley S1813 photoresist. Photolithography was used to define 18.7 μm period patterns in the photoresist with between 15 and 25% of the period defined as openings. The wafer was then placed in a holder with electrical contact made to the patterned −z face of the wafer and the unpatterned +z face of the wafer using a conductive liquid gel. During the poling process two stages of voltage pulses were applied to create a periodic domain inverted pattern in the wafers. The voltage used during the first domain nucleation stage was 5 kV and the pulse duration used was 1 ms with an on/off duty cycle ratio of 50:50. Several tens of pulses were used depending on the desired patterned area to be poled.

During the subsequent domain spreading stage of the poling process a single voltage pulse was used to propagate the poled areas formed during the nucleation stage such that the areas spread and merged to fill the area defined by the electrode pattern. The voltage used during the domain spreading phase was 4.5 kV for several minutes depending on the desired patterned area to be poled. Poling was performed at room temperatures of between 18° C. and 35° C. and in ambient conditions.

After poling to obtain PPLN from the original lithium niobate wafer, the PPLN wafer was masked with dicing tape on the +z side. The wafer was then etched in concentrated hydrofluoric acid (48% solution) for 10 minutes to reveal the PPLN grating(s) and allow precise alignment of the later dicing cuts with the gratings. Cleaning to remove particulates and organic residue was performed in fuming nitric acid for 10 minutes, and the wafer then entered a deionised water dump rinse tank and weir where ultra pure deionised water was flowed until a resistivity of 12 MΩ was reached. Afterwards, the wafer was spun dry at 3 krpm for 2 minutes.

Zinc sputtering to form the metallic zinc thin film layer was performed on an Oxford Instruments Plasmalab 400 sputterer. Zinc targets with 99.99% purity were used. The zinc sputter target was conditioned by removing a layer of ZnO grown whilst the target was not under vacuum. Conditioning was carried out at a vacuum of 5×10-8 mT, and 25 sccm of argon was made into a plasma at a pressure of 20 mT with a power of 300 W at a RF frequency of 13.56 MHz. This process was run for an hour, to remove ZnO from the zinc sputter target. The zinc deposition was then tested on silica wafers and checked with a stylus profiler (Tencor P16) to ensure the thickness variation over a 100 mm area did not exceed an RMS ±10%, before sputtering on to the PPLN wafers. A 100 nm thick layer of zinc, the thickness determined from the FIG. 4 experiment, was sputtered on the PPLN wafer at a vacuum of $5\times10^{-8}$ mT, with 25 sccm of argon made into a plasma at a pressure of 20 mT with a power of 300 W at an RF frequency of 13.56 MHz for about 60 seconds (according to a required duration determined from previous calibration).

The zinc layer was then indiffused into the PPLN wafer. A furnace was first calibrated by running a tube with only wafer boats. The indiffusion temperature was then adjusted to be 945±1° C. throughout the process zone of the tube furnace, in accordance with the 945° C. indiffusion temperature determined in the FIG. 5 experiment. Then the wafer was loaded into the tube, a 2 l/min flow of pure oxygen was set, and a temperature ramp rate of 5° C./min increase was applied until a furnace temperature of 935° C. was reached. Then the ramp rate was reduced to 1° C./min until the desired indiffusion temperature of 945° C. was reached. The indiffusion temperature was held for an hour, and then a ramp rate down in temperature of 5° C./min was applied until the cooling rate became restricted because of the thermal mass of the furnace. The indiffused PPLN wafer was removed once at room temperature. Note that multiple wafers were indiffused in a single operation of the furnace.

The zinc indiffusion formed the expected planar optical waveguide within the wafer, to provide vertical confinement of an optical mode. The addition of ridge waveguides via precision dicing to provide horizontal confinement of the optical mode was then performed. A dicing saw from Disco HiTec Corporation was used throughout for all cutting steps described below. The wafer was mounted on dicing tape with the +z face to be processed. A resin bonded dicing blade (Disco P1A series) was used for waveguide and facet definition. Before the dicing blade was used to machine the wafer it was dressed. Dressing was performed in a dresser board (Disco F50) at a blade rotation speed of 20 krpm, a sample translation speed of 5 mm/s and a depth of cut of 150 µm for 10 cut lines. After dressing of the blade, the diced groove or channel width was assessed to enable machining of waveguides of the correct ridge width. The assessment was carried out by cutting four grooves or test channels into the PPLN wafer and away from the device area (area containing the gratings) of the PPLN wafer. The width of the grooves was measured on a machine at various points and an average groove width calculated from these measurements. Using this information, ridge waveguides of width 13, 12.5, 12, 11.5 and 11 µm were machined into the PPLN grating by cutting parallel channels at the appropriate locations and spacing, using a depth of cut of 60 µm. This provision on a single grating (and hence on a single device or chip) of ridges with various width allows for a robust manufacturing process in which tolerance to variations in zinc indiffusion and in groove width is built in. The ridge waveguide on a device which gives the best operation can be selected for use; this ensures that an individual device can be expected to provide high nonlinear efficiency and low loss optical coupling. This variety of ridge widths is in accordance with the FIGS. 4 and 5 experiments. Once the ridge waveguides were defined, the dicing blade was dressed again in a similar fashion as before, and used to machine input/output facets at the desired device length (length of waveguide/grating), for example 40 mm, with a depth of cut of 150 µm.

After waveguide definition and end facet definition, individual chips or devices were singulated from the wafer. A different dicing blade (Disco Z09) was used for this process, again after dressing as before. The chips were diced with a staggered depth of cut offset outwardly from the end facets of 300 µm. After this the chips were cleaned in a post-dicing cleaning system (Disco DCS 1460). The devices were irradiated with UV light for 5 minutes and demounted from the dicing tape. The waveguides were antireflection coated for the intended wavelengths of operation.

Figure 6:
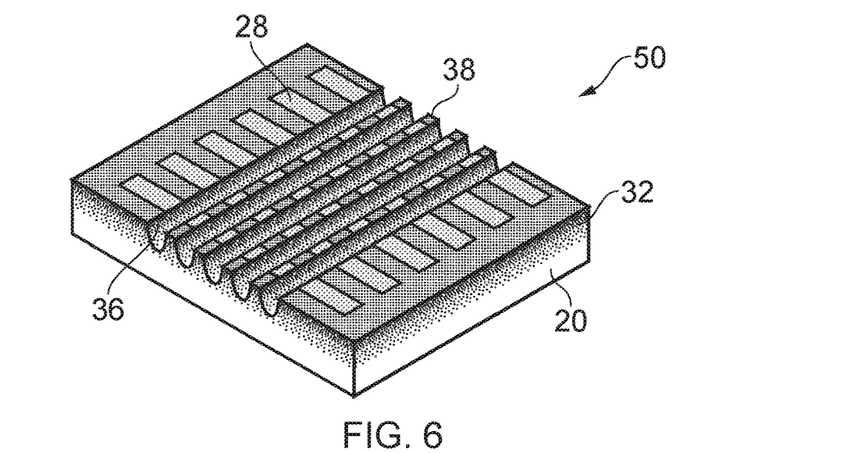
FIG. 6 shows a perspective schematic view of an example ridge waveguide device according to the disclosure, fabricated according to a method of the disclosure, and comprising multiple ridge waveguides.

FIG. 6 show a perspective schematic view of an example ridge waveguide device such as might be produced by a method described herein. The device 50, fabricated from a PPLN wafer 20, comprises a periodically poled grating 28, an indiffused layer of zinc 32 in its upper part extending down from the top surface to provide vertical optical confinement, and five parallel grooves or channels 36 cut into the top surface of the wafer 20 along the propagation direction of the grating 28. The five channels 36 define four ridge waveguides 38, each ridge waveguide 38 defined between an adjacent pair of channels 36. As noted above, the ridge waveguides 38 may each have a different ridge width, to provide tolerance to any variation in the thickness of the zinc layer 32 and/or the quality and positioning of the channels 36. The different ridge widths can compensate for variations in these parameters, so that the best performing waveguide can be selected for use of the device 50. Alternatively, a plurality of ridges of the same width might be provided (or two or more ridges within the group may have the same width) to provide some redundancy in the device in case any ridge is defective in some way, or to provide for parallel propagation of multiple optical signals. A device is not limited to five grooves 36 and four waveguides 38 as illustrated; any number can be provided, including a single waveguide 38 defined between two grooves 36.

Figure 7:
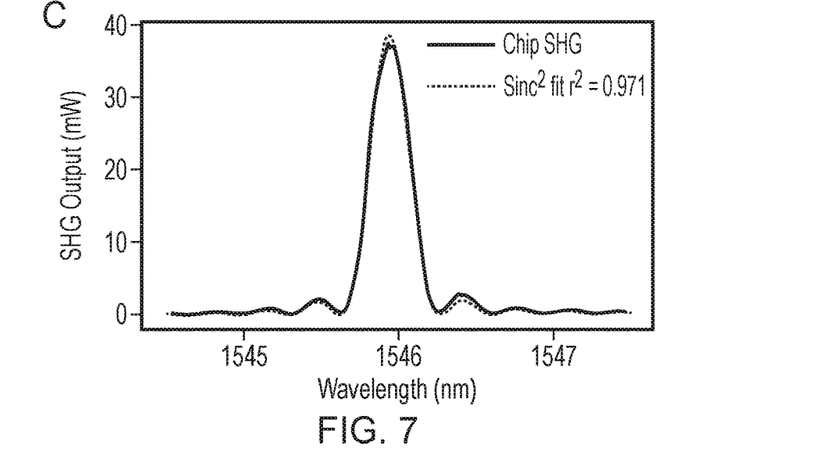
FIG. 7 shows a graph of the variation of measured second harmonic generation output power with input pump wavelength for a ridge waveguide fabricated according to a method of the disclosure, fitted to a theoretical curve.
Figure 8:
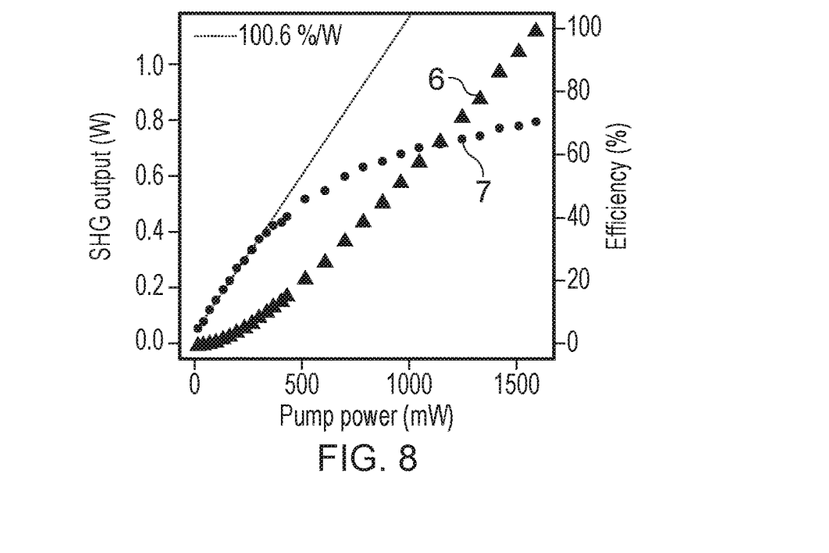
FIG. 8 shows a graph of the variation of second harmonic power output and second harmonic generation efficiency with input pump power for another ridge waveguide fabricated according to a method of the disclosure.

FIGS. 7 and 8 indicate second harmonic generation performance obtainable from the ridge waveguides. FIG. 7 shows a phase matching spectrum in the form of a plot of the variation of measured SHG output power in mW with input pump wavelength, indicated by the solid line. The dotted line is the $sinc^2$ function representing the theoretical power profile of phase matched SHG. The measured spectrum is very close to the $sinc^2$ profile ($r^2$=0.971), which indicates high conversion efficiency in the nonlinear interaction, arising from the quality of the waveguide. The quality of this result arises from the high uniformity of the waveguide dimensions, where the zinc deposition and indiffusion processes produce a consistent planar waveguiding layer, and the use of dicing produces a consistent ridge width, and smooth ridge sides.

FIG. 8 shows a graph indicating the variation of measured SHG output power (mW) with input pump power (mW) (labelled "6") and the variation of efficiency (%) with input pump power (labelled "7"). It can be seen that SHG powers in excess of 1 W are obtainable, at efficiencies in excess of 60%. Typical MFDs of the 1560 nm pump beam are 8.7 µm and 9.5 µm, and for the 780 nm signal beam are 9.9 µm and 9.6 µm, in the x and y axes respectively (with the z-axis being the propagation direction along the waveguide). These values indicate good single mode beam profiles, and the similar MFDs indicate a high level of overlap between the pump beam and the signal beam, which contributes to the high conversion efficiency. Also, the mode size is relatively large for this type of device, so the corresponding lower intensity avoids photorefractive damage. Lower intensity also allows higher powers to be tolerated, giving access to high conversion efficiencies at power levels greatly in excess of what is typical for PPLN waveguide devices which generally operate in the 100 mW regime only (with bulk crystal PPLN devices reserved for multi-watt systems), using a very small beam size in a short device in order to maximise efficiency. This small-beam short-device approach is not suitable for scaling to higher powers, owing to damage which is caused by parasitic nonlinear effects which come into play at higher intensities.

In other experiments, total conversion efficiencies approaching 70% for 1 W and more of SHG power have been measured. These power levels make the devices suitable for applications such as atom trapping, for which a minimum 1 W power at about 780 nm is desired (780.2 nm being the $Rb^{87}$ $D_2$ atomic cooling transition).

Additionally, the MFD of the waveguides is well-matched to that of the widely-used silica single mode PM1550 optical fibre manufactured by Corning®, making this fibre highly suitable for coupling light into and out of the waveguides with low loss. The method also enables a relatively large aperture for the input and output facets (around 10 µm by 10 µm) of an individual ridge waveguide, which offers a reduced launch tolerance for optical systems. Coupling efficiencies for injecting and collecting light into and out of the waveguide of 80% or above have been demonstrated.

While generally useful, this is particularly beneficial for quantum technology systems utilising single photons, where loss cannot be tolerated. The large aperture size can be contrasted with that of known PPLN waveguides with typical apertures of only a few micrometres, or even below 1 μm in order to achieve high efficiency from single mode operation. Such devices have good internal operating efficiency but poor overall performance when integrated into larger optical systems.

The high level of waveguide uniformity which can be obtained according to the method described herein enhances the efficiency. The uniformity allows longer waveguides, with a corresponding longer nonlinear interaction length, to operate successfully, whereas in known devices, a lack of waveguide uniformity tends to limit overall efficiency of longer devices due to variation of the phasematching condition along the device length. Device lengths of 40 mm and longer are achievable which are still able to provide excellent performance.

The various numerical parameters given herein may be modified in order to provide a PPLN ridge waveguide configured for quasi-phasematching of other nonlinear optical interactions than second harmonic generation. For example, the ridge waveguide might be configured for, but not limited to, sum frequency generation, difference frequency generation, optical parametric amplification, optical parametric oscillation, optical parametric generation, or spontaneous parametric downconversion.

The various embodiments described herein are presented only to assist in understanding and teaching the claimed features. These embodiments are provided as a representative sample of embodiments only, and are not exhaustive and/or exclusive. It is to be understood that advantages, embodiments, examples, functions, features, structures, and/or other aspects described herein are not to be considered limitations on the scope of the invention as defined by the claims or limitations on equivalents to the claims, and that other embodiments may be utilised and modifications may be made without departing from the scope of the claimed invention. Various embodiments of the invention may suitably comprise, consist of, or consist essentially of, appropriate combinations of the disclosed elements, components, features, parts, steps, means, etc., other than those specifically described herein. In addition, this disclosure may include other inventions not presently claimed, but which may be claimed in the future.

REFERENCES

[1] P. F. Bordui and M. M. Fejer, "Inorganic crystals for nonlinear optical frequency conversion", Anna. Rev. Mater. Sci. 23, 321-379 (1993).

[2] C. Langrock, S. Kumar, J. E. McGeehan, A. E. Willner, and M. M. Fejer, "All-optical signal processing using χ(2) nonlinearities in guided-wave devices", J. Light. Technol. 24(7), 2579-2592 (2006).

[3] P. R. Sharapova, K. H. Luo, H. Herrmann, M. Reichelt, T. Meier, and C. Silberhorn, "Toolbox for the design of LiNbO$_3$-based passive and active integrated quantum circuits", New J. Phys. 19(123009), (2017).

[4] S. Pal, B. K. Das, and W. Sohler, "Photorefractive damage resistance in Ti:PPLN waveguides with ridge geometry", Appl. Phys. B 120, 737-749 (2015).

[5] T. Umeki, O. Tadanaga, and M. Asobe, "Highly efficient wavelength converter using direct-bonded PPZnLN ridge waveguide", IEEE J. Quantum Electron., 46(8), 1206-1213 (2010).

[6] R. Kou, S. Kurimura, K. Kikuchi, A. Terasaki, H. Nakajima, K. Kondou, and J. Ichikawa, "High-gain, wide-dynamic-range parametric interaction in Mg-doped LiNbO$_3$ quasi-phase-matched adhered ridge waveguide", Opt. Express 19(12), 11867-11872 (2011).

[7] M. Chauvet, F. Henrot, F. Bassignot, F. Devaux, L. Gauthier-Manuel, V. Pécheur, H. Maillotte and B. Dahmani, "High efficiency frequency doubling in fully diced LiNbO$_3$ ridge waveguides on silicon", J. Opt. 18 (085503), (2016).

[8] G. D. Boyd, R. V. Schmidt, and F. G. Storz, "Characteristics of metal-diffused LiNbO$_3$ for acoustic devices", J. Appl. Phys. 48(7), 2880-2881 (1977).

[9] W. Tsai, T. Chiang, L. Liu, P. Chang, and Y. Su, "Time and temperature dependent study of Zn and Ni codiffused LiNbO$_3$ waveguides", J. Light. Technol. 33(23), 4950-4956 (2015).

[10] E. Cantelar, J. A. Sanz-Garcia, G. Lifante, F. Cussó and P. L. Pernas, "Single polarized Tm3+ laser in Zn-diffused LiNbO$_3$ channel waveguides", J. Appl. Phys. 86(161119), (2005).

[11] R. Twu, C. Huang, and W. Wang, "Zn indiffusion waveguide polarizer on a Y-cut LiNbO$_3$ at 1.32-μm wavelength", IEEE Photonics Technol. Lett., 12(2), 161-163 (2000).

[12] W. M. Young, R. S. Feigelson, M. M. Fejer, M. J. F. Digonnet, A. F. Marshall, and H. J. Shaw, "Photorefractive-damage-resistant Zn-diffused waveguides in MgO:LiNbO$_3$", Opt. Lett., 16(13), 995-997 (1991).

[13] W. M. Young, M. M. Fejer, M. J. F. Digonnet, A. F. Marshall, and R. S. Feigelson, "Fabrication, characterization and index profile modeling of high-damage resistance Zn diffused waveguides in congruent and MgO:lithium niobate", J. Light. Technol. 10(9), 1238-1246 (1992).

[14] L. Ming, C. B. E. Gawith, K. Gallo, M. V. O'Connor, G. D. Emmerson, and P. G. R. Smith, "High conversion efficiency single-pass second harmonic generation in a zinc diffused periodically poled lithium niobate waveguide", Opt. Expres 13(13), 4862-4868 (2005).

[15] WO 2005/052682

[16] C. Wang, C. Langrock, A. Marandi, M. Jankowski, M. Zhang, B. Desiatov, M. M. Fejer, and M. Lončar, "Ultrahigh-efficiency wavelength conversion in nanophotonic periodically poled lithium niobate waveguides," Optica 5, 1438-1441 (2018).

[17] H. E. Major, C. B. E. Gawith, P. G. R. Smith, "Gouy phase compensation in quasiphase matching", Optics Communications, 281(19) (2008)

[18] WO 2009/101390

The invention claimed is:

1. A method for fabricating an optical waveguide, the method comprising:
providing a sample of lithium niobate doped with magnesium oxide and having at least one grating of periodic domain inversion defined therein;
applying a layer of metallic zinc to a surface of the sample over the at least one grating using sputter deposition;
heating the sample in an atmosphere of pure oxygen to cause the zinc to indiffuse into the lithium niobate to form a waveguiding layer of increased refractive index under the surface of the sample; and
using a dicing blade to cut two substantially parallel channels along a length direction of the at least one grating, to define a ridge waveguide between the two channels.

2. A method according to claim 1, in which the sample has a plurality of gratings of periodic domain inversion defined therein.

3. A method according to claim 1, further comprising identifying a location of the at least one grating within the sample before applying the layer of metallic zinc, to facilitate positioning of the channels with respect to the at least one grating.

4. A method according to claim 3, comprising masking a surface of the sample, etching an opposite surface of the sample with hydrofluoric acid in order to expose the at least one grating, and removing the masking in order to deposit the layer of metallic zinc on the unetched surface.

5. A method according to claim 1, further comprising cutting further channels orthogonal to the parallel channels at or near each end of the at least one grating in order to define ends facets for the at least one grating.

6. A method according to claim 5, further comprising cutting through the sample to singulate the at least one grating from the remainder of the sample.

7. A method according to claim 6, in which the singulating comprises cutting through the sample along lines spaced outwardly from the further channels in order to form a protruding step below each end facet.

8. A method according to claim 1, further comprising, before cutting any parallel channels, using the dicing blade to cut at least one test channel in an unwanted part of the sample, calculating an average channel width from two or more measurements of the width of the at least one test channel, and using the calculated average channel width to determine positioning of the parallel channels in order to define a ridge waveguide of a desired width.

9. A method according to claim 8, comprising making the two or more measurements of the width of the at least one test channel while the sample is maintained in situ with dicing apparatus comprising the dicing blade after cutting of the at least one test channel.

10. A method according to claim 1, further comprising cutting additional parallel channels along the length direction of the at least one grating, to define additional ridge waveguides between adjacent parallel channels.

11. A method according to claim 10, in which the additional parallel channels are spaced from one another so as to define ridge waveguides of different widths.

12. A method according to claim 1, in which the or each ridge waveguide has a width in the range of 11 µm to 13 µm.

13. A method according to claim 1, in which the layer of metallic zinc is deposited so as to have a thickness in the range of 50 nm to 200 nm.

14. A method according to claim 13, in which the layer of metallic zinc is deposited so as to have a thickness in the range of 80 nm to 120 nm.

15. A method according to claim 1, in which heating the sample comprises heating the sample at a temperature in the range of 850° C. to 1000° C. for an indiffusion period.

16. A method according to claim 15, in which heating the sample comprises heating the sample at a temperature in the range of 940° C. to 950° C. for an indiffusion period.

17. A method according to claim 15, in which the indiffusion period is substantially one hour.

18. A ridge optical waveguide or a device comprising a ridge optical waveguide fabricated using a method according to claim 1.

* * * * *